(12) United States Patent
Hsu

(10) Patent No.: US 10,477,678 B1
(45) Date of Patent: Nov. 12, 2019

(54) SUBSTRATE STRUCTURE AND MANUFACTURING METHOD THEREOF

(71) Applicant: Unimicron Technology Corp., Taoyuan (TW)

(72) Inventor: Cheng-I Hsu, Tainan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/285,210

(22) Filed: Feb. 26, 2019

(30) Foreign Application Priority Data

Jan. 9, 2019 (TW) .............................. 108100784 A

(51) Int. Cl.
- *H05K 1/14* (2006.01)
- *H05K 3/46* (2006.01)
- *H05K 1/02* (2006.01)
- *H01L 23/48* (2006.01)

(52) U.S. Cl.
CPC ......... *H05K 1/0298* (2013.01); *H01L 23/481* (2013.01); *H05K 1/144* (2013.01); *H05K 3/46* (2013.01); *H05K 3/467* (2013.01)

(58) Field of Classification Search
CPC ....... H05K 1/144; H05K 3/467; H05K 3/4673
See application file for complete search history.

(56) References Cited

FOREIGN PATENT DOCUMENTS

| CN | 103209540 | 7/2013 |
|----|-----------|--------|
| TW | M450822   | 4/2013 |
| TW | I433285   | 4/2014 |

OTHER PUBLICATIONS

"Office Action of Taiwan Counterpart Application", dated May 21, 2019, p. 1-p. 5.

*Primary Examiner* — Jeremy C Norris
(74) *Attorney, Agent, or Firm* — JCIPRNET

(57) ABSTRACT

A substrate structure includes an insulating material layer, a build-up circuit layer, a patterned conductive layer, and at least one damming protrusion. The insulating material layer has a first surface and a second surface opposite the first surface. The build-up circuit layer is disposed on the second surface. The patterned conductive layer is embedded in the insulating material layer and exposed on the first surface of the insulating material layer, and is electrically connected to the build-up circuit layer. The damming protrusion is disposed on the first surface of the insulating material layer and integrally formed with the insulating material layer. A manufacturing method of the above substrate structure is also provided.

19 Claims, 3 Drawing Sheets

SUBSTRATE STRUCTURE AND MANUFACTURING METHOD THEREOF

CROSS-REFERENCE TO RELATED APPLICATION

This application claims the priority benefit of Taiwan application serial no. 108100784, filed on Jan. 9, 2019. The entirety of the above-mentioned patent application is hereby incorporated by reference herein and made a part of this specification.

BACKGROUND OF THE INVENTION

Field of the Invention

The invention relates to a substrate structure and a manufacturing method thereof, and more particularly, to a substrate structure and a manufacturing method thereof having a damming protrusion made of an insulating material.

Description of Related Art

A solder mask is typically added to a finished board surface to protect the circuitry on the circuit board. Currently commonly used solder resist materials include: AUS 320, AUS SR-1, AUS 410, and the like. However, since the solder mask is often accompanied by a high-temperature process such as ultraviolet curing and heat curing during manufacture, the issue of warping readily occurs to the circuit board. In addition, the damming protrusion made of the above solder resist materials has the issue of poor bonding in addition to a second high-temperature process, such that the size of the damming protrusion cannot be further reduced, and the issue of poor accuracy readily occurs.

SUMMARY OF THE INVENTION

The invention provides a substrate structure having a thinner damming protrusion and better accuracy.

The invention provides a manufacturing method of a substrate structure that may alleviate the issues of warping and poor adhesion.

A substrate structure of the invention includes an insulating material layer, a build-up circuit layer, a patterned conductive layer, and at least one damming protrusion. The insulating material layer has a first surface and a second surface opposite the first surface. The build-up circuit layer is disposed on the second surface. The patterned conductive layer is embedded in the insulating material layer and exposed on the first surface of the insulating material layer, and is electrically connected to the build-up circuit layer. The damming protrusion is disposed on the first surface of the insulating material layer and integrally formed with the insulating material layer.

In an embodiment of the invention, the material of the insulating material layer and the damming protrusion is ABF.

In an embodiment of the invention, the top surface of the patterned conductive layer is lower than the first surface of the insulating material layer.

In an embodiment of the invention, a width of the damming protrusion is less than 100 microns.

The manufacturing method of the substrate structure of the invention includes the following steps. A core layer is provided. A patterned copper layer is formed on the core layer, wherein the patterned copper layer has at least one patterned opening region. A patterned nickel layer and a patterned conductive layer are formed on the patterned copper layer. An insulating material layer is pressed on the patterned conductive layer such that the insulating material layer covers the patterned copper layer and the patterned conductive layer and is filled in the patterned opening region. A build-up circuit layer is formed on a second surface of the insulating material layer. The core layer, the patterned copper layer, and the patterned nickel layer are sequentially removed to form at least one damming protrusion. The patterned conductive layer is embedded in the insulating material layer and exposed on the first surface of the insulating material layer, and is electrically connected to the build-up circuit layer. The damming protrusion is disposed on a first surface opposite the second surface of the insulating material layer and integrally formed with the insulating material layer.

In an embodiment of the invention, the core layer includes a core dielectric layer, a copper foil layer, and a release layer. The release layer and the core dielectric layer are respectively located at two opposite sides of the copper foil layer.

In an embodiment of the invention, the manufacturing method of the substrate structure further includes the following steps. A nickel layer is formed on the core layer before the patterned copper layer is formed on the core layer; a copper layer is formed on the nickel layer such that the copper layer and the core layer are respectively located at two opposite sides of the nickel layer; and an etching process is performed to form the patterned opening region. The nickel layer is removed before the patterned copper layer is removed.

In an embodiment of the invention, the patterned opening region exposes a portion of the nickel layer.

In an embodiment of the invention, the step of forming the patterned copper layer on the core layer includes the following steps. A patterned photoresist layer is formed on the core layer, wherein the patterned photoresist layer has a plurality of patterned opening regions. A copper layer is formed in the patterned opening regions. The patterned photoresist layer is removed to form a patterned copper layer.

In an embodiment of the invention, the patterned opening regions expose the core layer.

Based on the above, in the substrate structure and the manufacturing method thereof of the invention, the substrate structure includes an insulating material layer, a build-up circuit layer, a patterned conductive layer, and at least one damming protrusion. The patterned conductive layer is embedded in the insulating material layer and exposed on the first surface of the insulating material layer, and is electrically connected to the build-up circuit layer. The damming protrusion is disposed on the first surface of the insulating material layer and integrally formed with the insulating material layer. With this design, the substrate structure of the invention may have a thinner damming protrusion and better accuracy, and the manufacturing method of the substrate structure of the invention may alleviate the issues of warping and poor adhesion.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated

DESCRIPTION OF THE EMBODIMENTS

FIG. 1A to FIG. 1G show cross sections of a manufacturing method of a substrate structure of an embodiment of the invention.

Figure 1A:
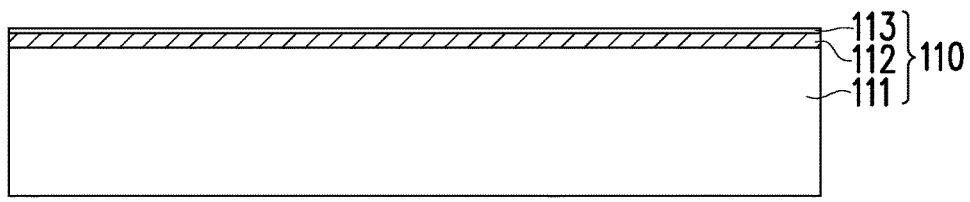
FIG. 1A to FIG. 1G show cross sections of a manufacturing method of a substrate structure of an embodiment of the invention.

Referring to FIG. 1A, in the present embodiment, first, a core layer 110 is provided. The core layer 110 includes a core dielectric layer 111, a copper foil layer 112 (having a thickness of, for example, 18 microns, but not limited thereto), and a release layer 113 (having a thickness of, for example, 5 microns, but not limited thereto). The release layer 113 and the core dielectric layer 111 are respectively located at two opposite sides of the copper foil layer 112. Here, the material of the core dielectric layer 111 includes an organic substrate or the like, but is not limited thereto.

Figure 1B:
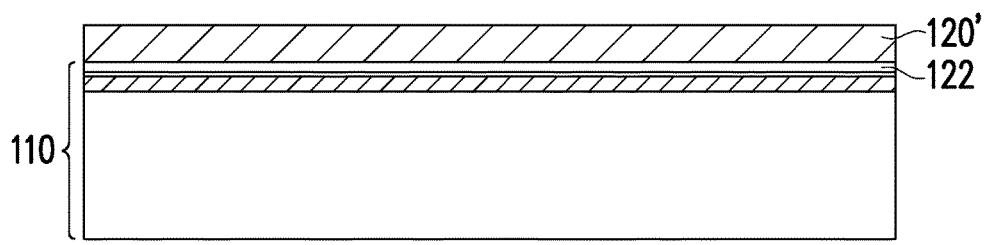
Figure 1C:
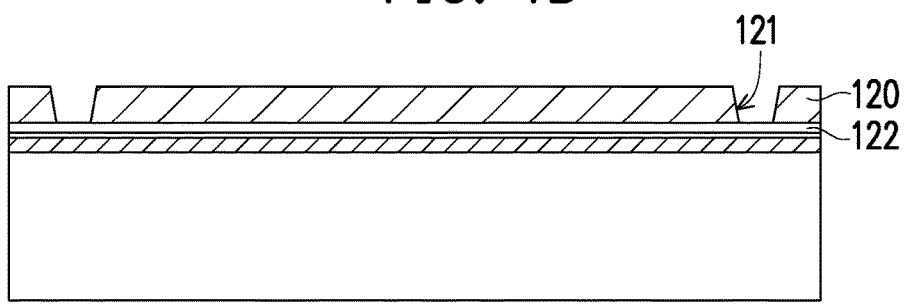

Referring to both FIG. 1B and FIG. 1C, a patterned copper layer 120 is formed on the core layer 110, wherein the patterned copper layer 120 has at least one patterned opening region 121. In detail, the steps of forming the patterned copper layer 120 include: referring to FIG. 1B, a nickel layer 122 is first formed on the core layer 110, and then a copper layer 120' is formed on the nickel layer 122. In particular, the copper layer 120' completely covers the nickel layer 122, and the copper layer 120' and the core layer 110 are respectively located at two opposite sides of the nickel layer 122. Next, referring to FIG. 1C, an etching process is performed on the copper layer 120' to form the patterned opening region 121. In particular, the patterned opening region 121 exposes a portion of the nickel layer 122. Here, the method of forming the copper layer 120' and the nickel layer 122 is, for example, electroplating or sputtering.

Figure 1D:
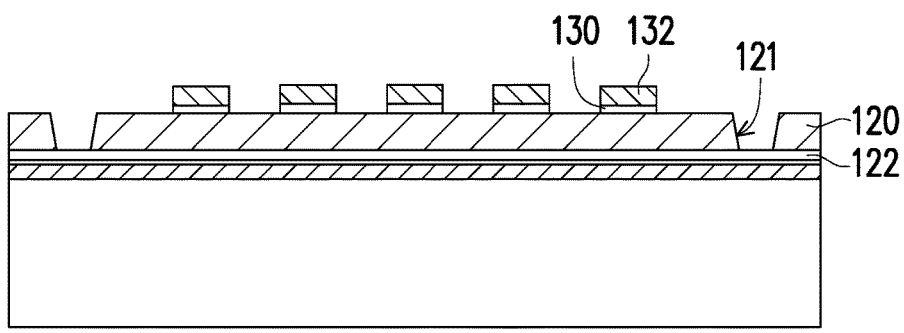

Referring to FIG. 1D, a patterned nickel layer 130 and a patterned conductive layer 132 are formed on the patterned copper layer 120. In particular, the patterns of the patterned nickel layer 130 and the patterned conductive layer 132 are completely overlapped, and the patterned nickel layer 130 and the patterned conductive layer 132 do not cover the patterned opening region 121 of the patterned copper layer 120. The patterned conductive layer 132 and the patterned copper layer 120 are respectively located at two opposite sides of the patterned nickel layer 130. Here, the method of forming the patterned nickel layer 130 and the patterned conductive layer 132 is, for example, an electroplating method.

Figure 1E:
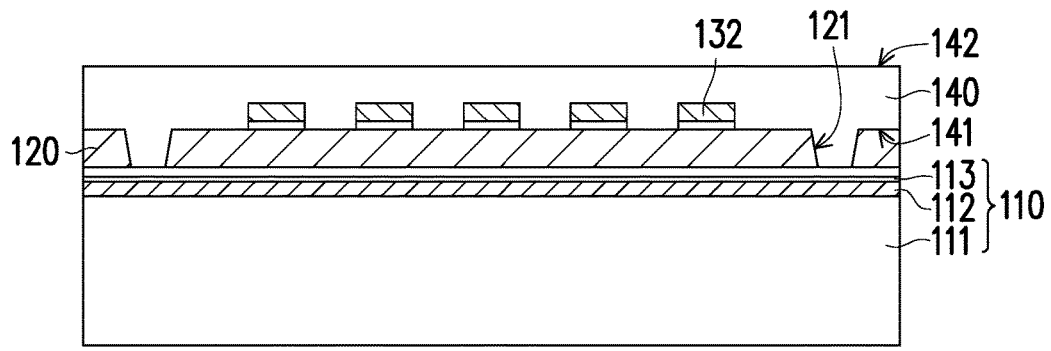

Referring to FIG. 1E, an insulating material layer 140 is pressed on the patterned conductive layer 132 such that the insulating material layer 140 covers the patterned copper layer 120 and the patterned conductive layer 132 and is filled in the patterned opening region 121. The insulating material layer 140 has a first surface 141 and a second surface 142 opposite the first surface 141. In particular, the first surface 141 faces the patterned copper layer 120, and the second surface 142 faces away from the patterned copper layer 120. Here, the method of pressing the insulating material layer 140 on the patterned conductive layer 132 is, for example, a hot press method. In the present embodiment, the material of the insulating material layer 140 may be an ABF (Ajinomoto build-up film) resin.

Figure 1F:
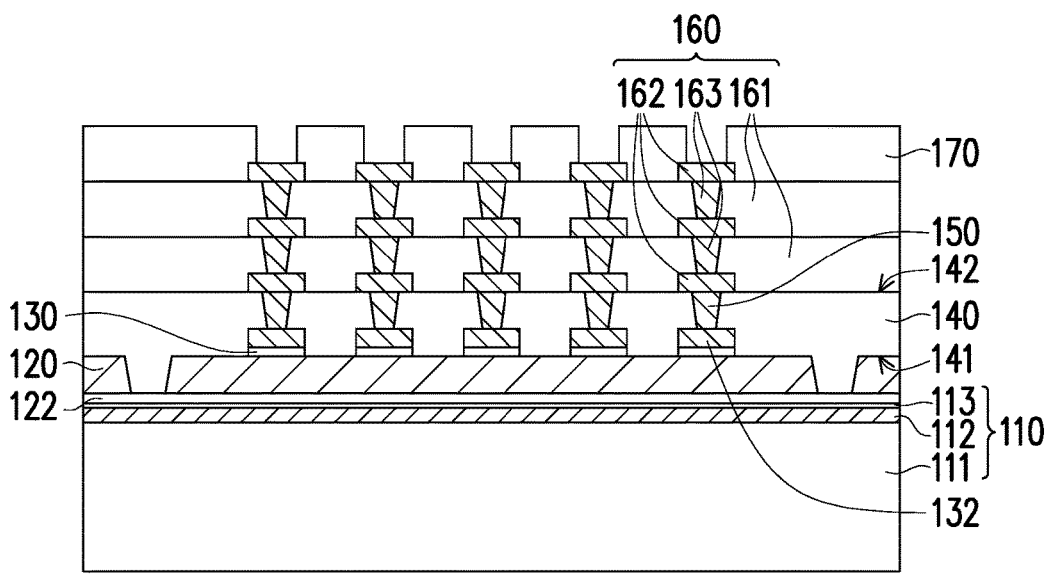

Referring to FIG. 1F, a conductive through-hole 150 is first formed so that the conductive through-hole 150 penetrates the insulating material layer 140 and is electrically connected to the patterned conductive layer 132. Next, a build-up circuit layer 160 is formed on the second surface 142 of the insulating material layer 140. In particular, the build-up circuit layer 160 includes at least one first dielectric layer 161, at least one first circuit layer 162, and a plurality of first vias 163. In particular, the first circuit layer 162 and the first dielectric layer 161 are sequentially stacked on the insulating material layer 140, and the first vias 163 penetrate the first dielectric layer 161 and are electrically connected to the first circuit layer 162. Here, the build-up circuit layer 160 may be electrically connected to the patterned conductive layer 132 via the conductive through-hole 150 in the insulating material layer 140.

It should be noted that although the build-up circuit layer 160 of the present embodiment has two first dielectric layers 161, three first circuit layers 162, and a plurality of first vias 163, the invention does not limit the number of the first dielectric layer, the number of the first circuit layer, and the number of the first vias.

Next, a solder mask 170 is formed on the build-up circuit layer 160, and the solder mask 170 and the insulating material layer 140 are respectively located at two opposite sides of the build-up circuit layer 160. In particular, the solder mask 170 covers the first dielectric layer 161 of the build-up circuit layer 160 away from the insulating material layer 140 and a portion of the first circuit layer 162. Here, the material of the solder mask 170 includes AUS 320, AUS SR-1, and AUS 410, but is not limited thereto.

Figure 1G:
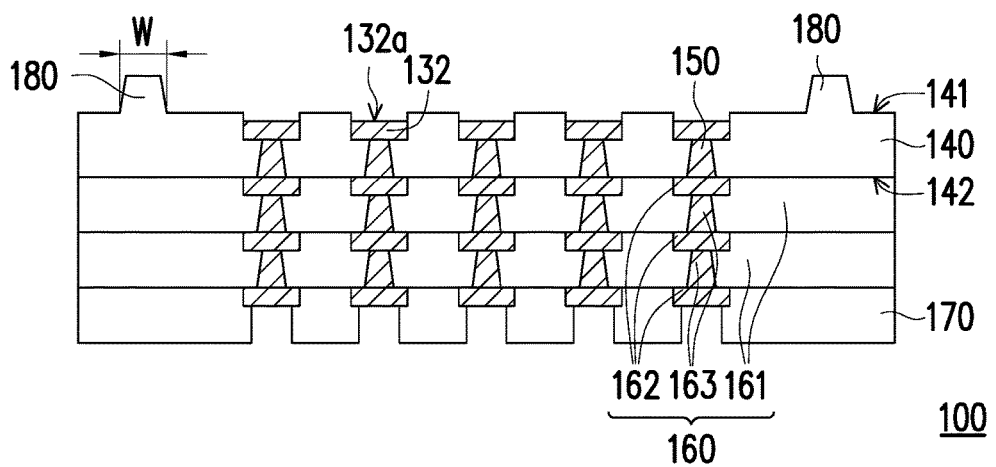

Referring to FIG. 1G, the core layer 110, the nickel layer 122, the patterned copper layer 120, and the patterned nickel layer 130 in FIG. 1F are sequentially removed to expose the first surface 141 of the insulating material layer 140 and a top surface 132a of the patterned conductive layer 132 and form at least one damming protrusion 180. In particular, the damming protrusion 180 is disposed on the first surface 141 of the insulating material layer 140. In the present embodiment, the damming protrusion 180 is integrally formed with and seamlessly joined to the insulating material layer 140, that is, the material forming the damming protrusion 180 is the same as the material forming the insulating material layer 140. In the present embodiment, the material of the damming protrusion 180 may be an ABF resin. In the present embodiment, a width W of the damming protrusion 180 is, for example, less than 100 microns and not 100 microns.

In addition, in the present embodiment, the patterned conductive layer 132 is embedded in the insulating material layer 140 and exposed on the first surface 141 of the insulating material layer 140, and the patterned conductive layer 132 may be electrically connected to the build-up circuit layer 160 via the conductive through-hole 150. In some embodiments, the top surface 132a of the patterned conductive layer 132 is lower than the first surface 141 of the insulating material layer 140. At this point, the manufacture of the substrate structure 100 is completed.

In short, the substrate structure 100 of the present embodiment includes an insulating material layer 140, a build-up circuit layer 160, a patterned conductive layer 132, and at least one damming protrusion 180. The insulating material layer 140 has a first surface 141 and a second surface 142 opposite the first surface 141. The build-up circuit layer 160 is disposed on the second surface 142. The patterned conductive layer 132 is embedded in the insulating material layer 140 and exposed on the first surface 141 of the insulating material layer 140, and is electrically connected to the build-up circuit layer 160. The damming protrusion 180 is disposed on the first surface 141 of the insulating material layer 140 and integrally formed with the insulating material layer 140. With this design, the substrate structure 100 of the present embodiment may have a thinner damming protrusion 180 and better accuracy, and the manufacturing method of the substrate structure of the present embodiment may alleviate the issues of warping and poor adhesion.

Additional embodiments are discussed below. It should be mentioned that, the embodiments below adopt the same reference numerals and portions of the content from previous embodiments. Specifically, the same reference numerals are used to represent the same or similar elements, and the descriptions for the same techniques are omitted. The omitted portions are as described in the embodiments above and are not repeated in the embodiments below.

Figure 2A:
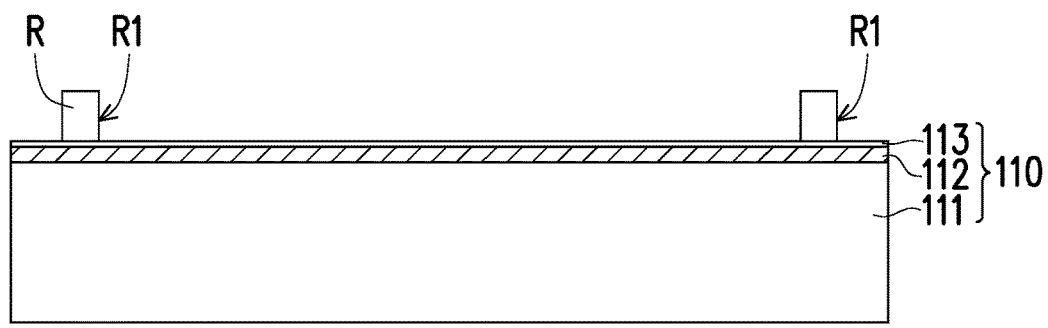
FIG. 2A to FIG. 2C show cross sections of a manufacturing method of a substrate structure of another embodiment of the invention.
Figure 2B:
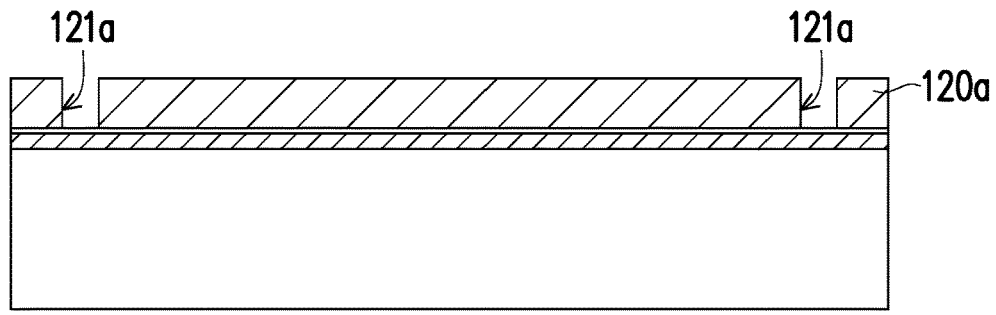
Figure 2C:
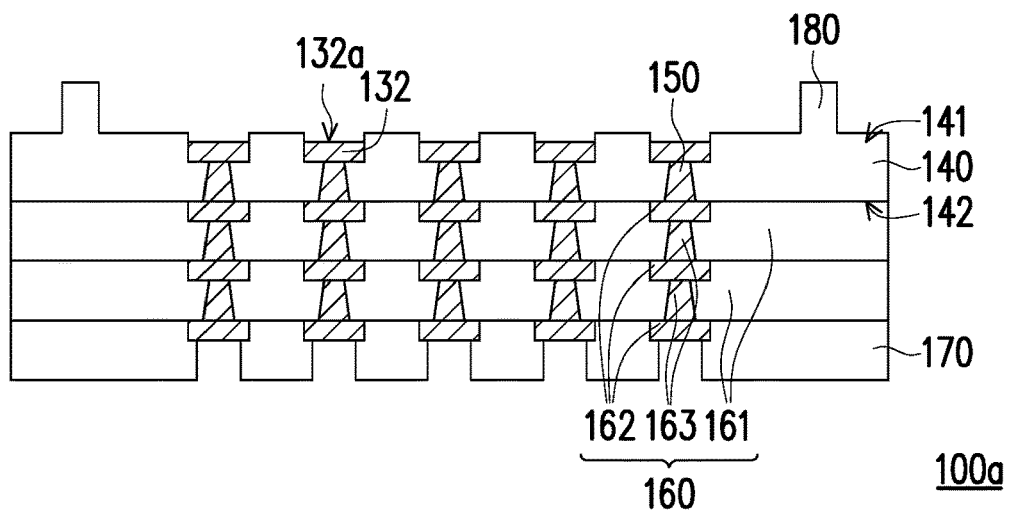

FIG. 2A to FIG. 2C show cross sections of a manufacturing method of a substrate structure of another embodiment of the invention. The embodiment shown in FIG. 2A to FIG. 2C is similar to the embodiment shown in FIG. 1A to FIG. 1G, and therefore the same elements are denoted by the same reference numerals, and the detailed description thereof are not repeated. The difference between the embodiment shown in FIG. 2A to FIG. 2C and the embodiment shown in FIG. 1A to FIG. 1G is the manner in which the patterned copper layer 120a is formed.

In detail, the manufacturing process of a substrate structure 100a of the present embodiment may be substantially the same as the manufacturing process of the substrate structure 100 of the embodiment above. In the present embodiment, the core layer 110 as shown in FIG. 1A is first provided. Next, referring to FIG. 2A, a patterned photoresist layer R is formed on the core layer 110. In particular, the patterned photoresist layer R has a plurality of patterned opening regions R1, and the patterned opening regions R1 expose the release layer 113 of the core layer 110.

Referring to FIG. 2B, a copper layer (not shown) is formed in the patterned opening regions R1, and then the patterned photoresist layer R is removed to form the patterned copper layer 120a. In particular, the patterned copper layer 120a has a patterned opening region 121a, and the patterned opening region 121a exposes a portion of the release layer 113. Here, the method of forming the copper layer is, for example, an electroplating method.

Then, after the steps of FIG. 1D to FIG. 1G are sequentially performed, the substrate structure 100a as shown in FIG. 2C may be obtained.

Based on the above, in the substrate structure and the manufacturing method thereof of the invention, the substrate structure includes an insulating material layer, a build-up circuit layer, a patterned conductive layer, and at least one damming protrusion. The patterned conductive layer is embedded in the insulating material layer and exposed on the first surface of the insulating material layer, and is electrically connected to the build-up circuit layer. The damming protrusion is disposed on the first surface of the insulating material layer and integrally formed with the insulating material layer. With this design, the substrate structure of the invention may have a thinner damming protrusion and better accuracy, and the manufacturing method of the substrate structure of the invention may alleviate the issues of warping and poor adhesion.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A substrate structure, comprising:
   an insulating material layer having a first surface and a second surface opposite the first surface;
   a build-up circuit layer disposed on the second surface;
   a patterned conductive layer embedded in the insulating material layer and exposed on the first surface of the insulating material layer and electrically connected to the build-up circuit layer; and
   at least one damming protrusion disposed on the first surface of the insulating material layer and integrally formed with the insulating material layer.

2. The substrate structure of claim 1, wherein a material of the insulating material layer and the damming protrusion is ABF.

3. The substrate structure of claim 1, wherein the build-up circuit layer comprises at least one first dielectric layer, at least one first circuit layer, and a plurality of first vias, wherein the first circuit layer and the first dielectric layer are sequentially stacked on the insulating material layer, and the first vias penetrate the first dielectric layer and are electrically connected to the first circuit layer.

4. The substrate structure of claim 1, further comprising:
   a solder mask disposed on the build-up circuit layer, wherein the solder mask and the insulating material layer are respectively located at two opposite sides of the build-up circuit layer.

5. The substrate structure of claim 1, further comprising:
   a conductive through-hole penetrating the insulating material layer and electrically connected to the patterned conductive layer and the build-up circuit layer.

6. The substrate structure of claim 1, wherein a top surface of the patterned conductive layer is lower than the first surface of the insulating material layer.

7. The substrate structure of claim 1, wherein a width of the damming protrusion is less than 100 microns.

8. A manufacturing method of a substrate structure, comprising:
   providing a core layer;
   forming a patterned copper layer on the core layer, wherein the patterned copper layer has at least one patterned opening region;
   forming a patterned nickel layer and a patterned conductive layer on the patterned copper layer;
   pressing an insulating material layer on the patterned conductive layer such that the insulating material layer covers the patterned copper layer and the patterned conductive layer and is filled in the patterned opening region;
   forming a build-up circuit layer on a second surface of the insulating material layer; and
   sequentially removing the core layer, the patterned copper layer, and the patterned nickel layer to form at least one damming protrusion,
   wherein the patterned conductive layer is embedded in the insulating material layer and exposed on a first surface of the insulating material layer and is electrically connected to the build-up circuit layer, and the damming protrusion is disposed on the first surface opposite the second surface of the insulating material layer and is integrally formed with the insulating material layer.

9. The manufacturing method of the substrate structure of claim 8, wherein the core layer comprises a core dielectric layer, a copper foil layer, and a release layer, and the release layer and the core dielectric layer are respectively located at two opposite sides of the copper foil layer.

10. The manufacturing method of the substrate structure of claim 8, further comprising:
forming a nickel layer on the core layer before forming the patterned copper layer on the core layer; forming a copper layer on the nickel layer such that the copper layer and the core layer are respectively located at two opposite sides of the nickel layer; and performing an etching process to form the patterned opening region; and
removing the nickel layer before removing the patterned copper layer.

11. The manufacturing method of the substrate structure of claim 10, wherein the patterned opening region exposes a portion of the nickel layer.

12. The manufacturing method of the substrate structure of claim 8, wherein the step of forming the patterned copper layer on the core layer comprises:
forming a patterned photoresist layer on the core layer, wherein the patterned photoresist layer has a plurality of patterned opening regions;
forming a copper layer in the patterned opening regions; and
removing the patterned photoresist layer to form the patterned copper layer.

13. The manufacturing method of the substrate structure of claim 12, wherein the patterned opening regions expose the core layer.

14. The manufacturing method of the substrate structure of claim 8, wherein a material of the insulating material layer and the damming protrusion is ABF.

15. The manufacturing method of the substrate structure of claim 8, wherein the build-up circuit layer comprises at least one first dielectric layer, at least one first circuit layer, and a plurality of first vias, wherein the first circuit layer and the first dielectric layer are sequentially stacked on the insulating material layer, and the first vias penetrate the first dielectric layer and are electrically connected to the first circuit layer.

16. The manufacturing method of the substrate structure of claim 8, further comprising:
forming a solder mask on the build-up circuit layer, wherein the solder mask and the insulating material layer are respectively located at two opposite sides of the build-up circuit layer.

17. The manufacturing method of the substrate structure of claim 8, further comprising:
forming a conductive through-hole penetrating the insulating material layer before forming the build-up circuit layer on the second surface of the insulating material layer to electrically connect the patterned conductive layer and the build-up circuit layer.

18. The manufacturing method of the substrate structure of claim 8, wherein a top surface of the patterned conductive layer is lower than the first surface of the insulating material layer.

19. The manufacturing method of the substrate structure of claim 8, wherein a width of the damming protrusion is less than 100 microns.

* * * * *